(12) United States Patent
Middleton et al.

(10) Patent No.: US 11,600,997 B2
(45) Date of Patent: Mar. 7, 2023

(54) BATTERY SYSTEM

(71) Applicant: Caterpillar Inc., Peoria, IL (US)

(72) Inventors: Justin D. Middleton, Peoria, IL (US); Jonathan M. Baumann, Hanna City, IL (US); Jason Lee Miller, Princeville, IL (US); Dustin C. Selvey, Eureka, IL (US); Adam R. Rosenberger, Peoria, IL (US); Evan B. Stumpges, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 245 days.

(21) Appl. No.: 17/016,114

(22) Filed: Sep. 9, 2020

(65) Prior Publication Data
US 2022/0077699 A1     Mar. 10, 2022

(51) Int. Cl.
*H02J 7/00* (2006.01)
*B60R 16/033* (2006.01)
*G01R 31/66* (2020.01)
*G01R 31/36* (2020.01)

(52) U.S. Cl.
CPC .......... *H02J 7/0036* (2013.01); *B60R 16/033* (2013.01); *G01R 31/36* (2013.01); *G01R 31/66* (2020.01); *H02J 7/0013* (2013.01)

(58) Field of Classification Search
None
See application file for complete search history.

(56) References Cited

U.S. PATENT DOCUMENTS

| 8,987,935 B2 | 3/2015 | King | |
| 9,525,291 B1* | 12/2016 | Huynh | B60L 53/665 |
| 2010/0084999 A1 | 4/2010 | Atkinson, Jr. | |
| 2020/0039339 A1* | 2/2020 | Naya | B60K 6/485 |
| 2021/0384746 A1* | 12/2021 | Zeiler | H01M 50/244 |
| 2022/0029431 A1* | 1/2022 | McLean | B60L 3/0046 |

FOREIGN PATENT DOCUMENTS

| CN | 107895974 A | 4/2018 |
| WO | 2019144205 A1 | 10/2019 |

* cited by examiner

*Primary Examiner* — Jared Fureman
*Assistant Examiner* — Aqeel H Bukhari
(74) *Attorney, Agent, or Firm* — Bookoff McAndrews PLLC; Charles S. Cohen

(57) ABSTRACT

In some aspects, a method of monitoring a battery system of an industrial vehicle is disclosed. The battery system may include a first string of battery modules including at least two battery modules connected in series; a first contactor connected to a positive end of the first string of battery modules, a second contactor connector to a negative end of the first string of battery modules; a third contactor connected to the first contactor; a fourth contactor connected to the second contactor; and one or more controllers configured to monitor the first contactor and the second contactor. The method may include receiving, at the one or more controllers, an indication of a failure of one of the first contactor and the second contactor; and opening, via the one or more controllers, at least one of the third contactor or the fourth contactor.

17 Claims, 7 Drawing Sheets

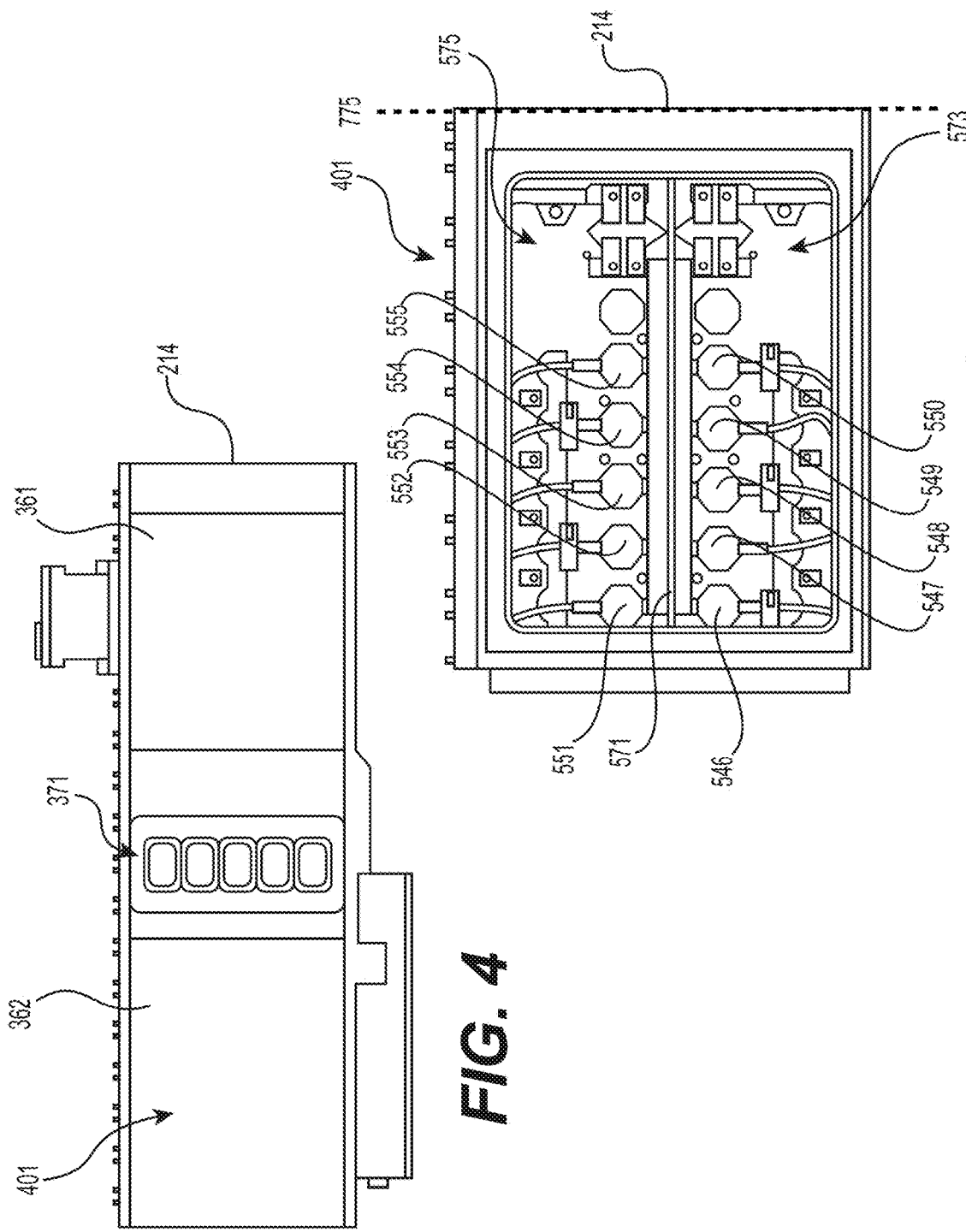

BATTERY SYSTEM

TECHNICAL FIELD

The present disclosure relates generally to a battery system for use in industrial equipment, and, more particularly, to a battery system for use in an industrial vehicle.

BACKGROUND

Industrial operations, such as mining operations involve complex operations that require large industrial machines, and machine operators to undertake challenging tasks in often dangerous environments. Typical industrial machines used in mining include continuous miners, feeder breakers, roof bolters, utility vehicles for mining, load-haul-dump (LHD) vehicles, underground mining loaders and underground articulated trucks, and these machines are under significant stress during everyday mining operations. For example, such mining machines may be subject to rocks falling onto the machine or the complete collapse or cave-in of a mine wall or roof onto the machine. In the case where significant amounts rock or other material has fallen onto the machine, components of the machine are at high risk of damage. The potential for injury of a machine operator from component damage, engine difficulties, or component fires caused by damage from falling rocks is high, and damage to a mining machine or other engine difficulties may indefinitely immobilize the machine, preventing the removal of the machine from the dangerous mining environment. These risks are amplified when utilizing a battery powered industrial vehicle that requires high voltages to operate.

A LHD vehicle or similar industrial machine is normally provided with a bucket, container or other type of work implement for carrying/transporting a load. Such industrial vehicles require engines operating with power consumption needs significantly higher than conventional cars or trucks. For example, in connection with transportation of heavy loads, e.g. in contracting work, industrial vehicles are frequently used. An industrial vehicle may be operated with large and heavy loads in areas where there are no roads, for example for transports in connection with road or tunnel building, sand pits, mines and similar environments, which often requires higher torque output to the wheels to navigate such environments.

Industrial vehicles for underground mining operations, such as haulers for room and pillar type mining, may be powered by large battery systems carried on the vehicles. Such a battery system may include a housing containing an array of electrochemical cells, allowing the vehicle to travel without cords throughout a mine for a limited period of time. Such battery systems require high voltages to power mining vehicles, and the high operating voltages of these battery systems create added risk to engine malfunctions or battery failures. It is desirable for battery systems in vehicles to include systems and devices to monitor battery operating parameters and detect failures in battery systems. Furthermore, large industrial vehicles may be difficult to move when a battery system failure occurs, and thus there is a need for battery systems that can allow a vehicle to operate after a partial battery system failure.

The battery systems according to this disclosure address one or more of the challenges set forth above and/or other problems in the art. The scope of the current disclosure, however, is defined by the attached claims, and not by the ability to solve any specific problem.

SUMMARY

This disclosure relates generally to the field of industrial vehicles. More specifically the present disclosure relates to systems, methods, and devices for controlling and monitoring a battery assembly for use with an industrial vehicle, such as a battery-powered, underground load-haul-dump machine.

In some aspects, a method of monitoring a battery system of an industrial vehicle is disclosed. The battery system may include a first string of battery modules including at least two battery modules connected in series; a first contactor connected to a positive end of the first string of battery modules; a second contactor connector to a negative end of the first string of battery modules; a third contactor connected to the first contactor; a fourth contactor connected to the second contactor; and one or more controllers configured to monitor the first contactor and the second contactor. The method may include receiving, at the one or more controllers, an indication of a failure of one of the first contactor and the second contactor; and opening, via the one or more controllers, at least one of the third contactor or the fourth contactor.

The method may include one or more of the following features. The method may include receiving, at the one or more controllers, an indication of a failure of one of the third contactor and the fourth contactor; and opening, via the one or more controllers, at least one of the first contactor or the second contactor. The battery system may further include a first precharge contactor and a first precharge resistor connected to a positive end of the first string of battery modules; and a second precharge contactor and a second precharge resistor connected to a negative end of the first string of battery modules. The battery system may further include a second string of battery modules including at least two battery modules connected in series, wherein the first string of battery modules is connected to the second string of battery modules in parallel; a fifth contactor connected to a positive end of the second string of battery modules and connected to the third contactor; and a sixth contactor connector to a negative end of the second string of battery modules and connected to the fourth contactor. The method may further include receiving, at the one or more controllers, an indication of a failure of one of the fifth contactor, or the sixth contactor; and opening, via the one or more controllers, at least one of the third contactor or the fourth contactor in response to the indication of a failure of one of the fifth contactor or the sixth contactor. The battery system may further include a first disconnect switch connected to the first string of battery modules; and a second disconnect switch connected to the second string of battery modules.

In some examples, the method may include one or more of the following features. The battery system may be configured to operate with 1) both the first string of battery modules and the second string of battery modules connected to the battery system, 2) only the first string of battery modules connected to the battery system and the second disconnect switch actuated to disconnect the second string of battery modules from the battery system, or 3) only the second string of battery modules connected to the battery system and the first disconnect switch actuated to disconnect the first string of battery modules from the battery system. The indication of a failure of one of the first contactor and the second contactor may include an indication that one of the first contactor or the second contactor has welded closed. The battery system may be configured to generate at least 200 kilowatt hours of energy. The one or more controllers is a first one or more controllers; wherein the first string of battery modules, the first contactor, the second contactor, the third contactor, and the fourth contactor are sealed within a first housing; and wherein the battery system further including a second string of battery modules including at least two battery modules connected in series; a fifth contactor connected to a positive end of the second string of battery modules; a sixth contactor connector to a negative end of the second string of battery modules; a seventh contactor connected to the fifth contactor; an eighth contactor connected to the sixth contactor; and a second one or more controllers configured to monitor the fifth contactor and the sixth contactor. The second string of battery modules, the fifth contactor, the sixth contactor, the seventh contactor, the eighth contactor, and the second one or more controllers may be sealed within a second housing. The method may further include opening, via the one or more controllers, at least one of the third contactor or the fourth contactor; and operating the industrial vehicle utilizing only power provided by the second string of battery modules.

In other aspects, a battery system may be provided in an industrial vehicle. The battery system may include a string of battery modules including a plurality of battery modules connected in series; a first contactor connected to a negative output of the string of battery modules; a second contactor connected to a positive output of the string of battery modules; a third contactor and a first precharge resistor each connected to the first contactor; a first precharge contactor connected to the first precharge resistor; a fourth contactor and a second precharge resistor each connected to the second contactor; and a second precharge contactor connected to the second precharge resistor.

The battery system may include one or more of the following features. The string of battery modules is a first string of battery modules, and the battery system may further include a second string of battery modules including a plurality of battery modules connected in series; a fifth contactor connected to a negative output of the second string of battery modules; a sixth contactor connected to a positive output of the second string of battery modules. The third contactor and the first precharge resistor may be each connected to the fifth contactor; and the fourth contactor and the second precharge resistor may be each connected to the sixth contactor. The battery system may further include a first controller connected to the first contactor and the second contactor; a second controller connected to the fifth contactor and the sixth contactor; and one or more controllers connected to the third contactor and the fourth contactor. The battery system may further include a first disconnect switch connected to the first string of battery modules; and a second disconnect switch connected the second string of battery modules. The battery system may be positioned within a sealed housing. Each of the first string of battery modules and the second string of battery modules may be configured to generate between 15 and 30 kilowatts per hour of energy. The battery system may further include a third string of battery modules including a plurality of battery modules connected in series; a seventh contactor connected to a negative output of the third string of battery modules; a eighth contactor connected to a positive output of the third string of battery modules; a fourth string of battery modules including a plurality of battery modules connected in series; a ninth contactor connected to a negative output of the fourth string of battery modules; a tenth contactor connected to a positive output of the fourth string of battery modules; a fifth string of battery modules including a plurality of battery modules connected in series; an eleventh contactor connected to a negative output of the fifth string of battery modules; a twelfth contactor connected to a positive output of the fifth string of battery modules. The third contactor and the first precharge resistor may each be connected to the seventh contactor, the ninth contactor, and the eleventh contactor; and the fourth contactor and the second precharge resistor may each be connected to the eighth contactor, the tenth contactor, and the twelfth contactor.

In some examples, the battery system may further include a sixth string of battery modules including a plurality of battery modules connected in series; a thirteenth contactor connected to a negative output of the sixth string of battery modules; a fourteenth contactor connected to a positive output of the sixth string of battery modules; a fifteenth contactor and a third precharge resistor each connected to the thirteenth contactor; a third precharge contactor connected to the third precharge resistor; a sixteenth contactor and a fourth precharge resistor each connected to the fourteenth contactor; and a fourth precharge contactor connected to the fourth precharge resistor. The first, second, third, fourth, and fifth strings of battery modules may be sealed within a first housing; and the sixth string of battery modules may be sealed within a second housing.

In other aspects, a battery system may be provided in an industrial vehicle, and the battery system may include a housing. The housing may include a first string of battery modules including a first plurality of battery modules connected in series and a first physical disconnect switch connected to the first plurality of battery modules; and a second string of battery modules including a second plurality of battery modules connected in series and a second physical disconnect switch connected to the second plurality of battery modules. The first string of battery modules and the second string of battery modules may be connected in parallel.

The battery system may include one or more of the following features. The battery system may be configured to operate when: 1) the first string of battery modules and the second string of battery modules are connected; 2) the first string of battery modules is connected and the second string of battery modules is disconnected via the second physical disconnect switch; and 3) the second string of battery modules is connected and the first string of battery modules is disconnected via the first physical disconnect switch. The housing may further include a first contactor connected to a negative terminal of the first string of battery modules; a second contactor connected to a positive terminal of the first string of battery modules; a third contactor connected to a negative terminal of the second string of battery modules; a fourth contactor connected to a positive terminal of the second string of battery modules; a fifth contactor and a first precharge resistor connected to the first contactor and the third contactor; a sixth contactor connected to the first precharge resistor; a seventh contactor and a second precharge resistor connected to the second contactor and the fourth contactor; and an eighth contactor connected to the second precharge resistor.

BRIEF DESCRIPTION OF THE DRAWINGS

FIG. 4 shows a top view of the portion of the battery system from FIG. 3, according to an exemplary embodiment.

FIG. 5 shows a top view of a portion of the battery system of FIG. 3 with a housing panel removed, according to an exemplary embodiment.

DETAILED DESCRIPTION

Both the foregoing general description and the following detailed description are exemplary and explanatory only and are not restrictive of the features, as claimed. As used herein, the terms "comprises," "comprising," "having," including," or other variations thereof, are intended to cover a non-exclusive inclusion, such that a process, method, article, or apparatus that comprises a list of elements does not include only those elements, but may include other elements not expressly listed or inherent to such a process, method, article, or apparatus. In addition, in this disclosure, relative terms, such as, for example, "about," "generally, "substantially," and "approximately" are used to indicate a possible variation of 10% in the stated value.

Figure 1:
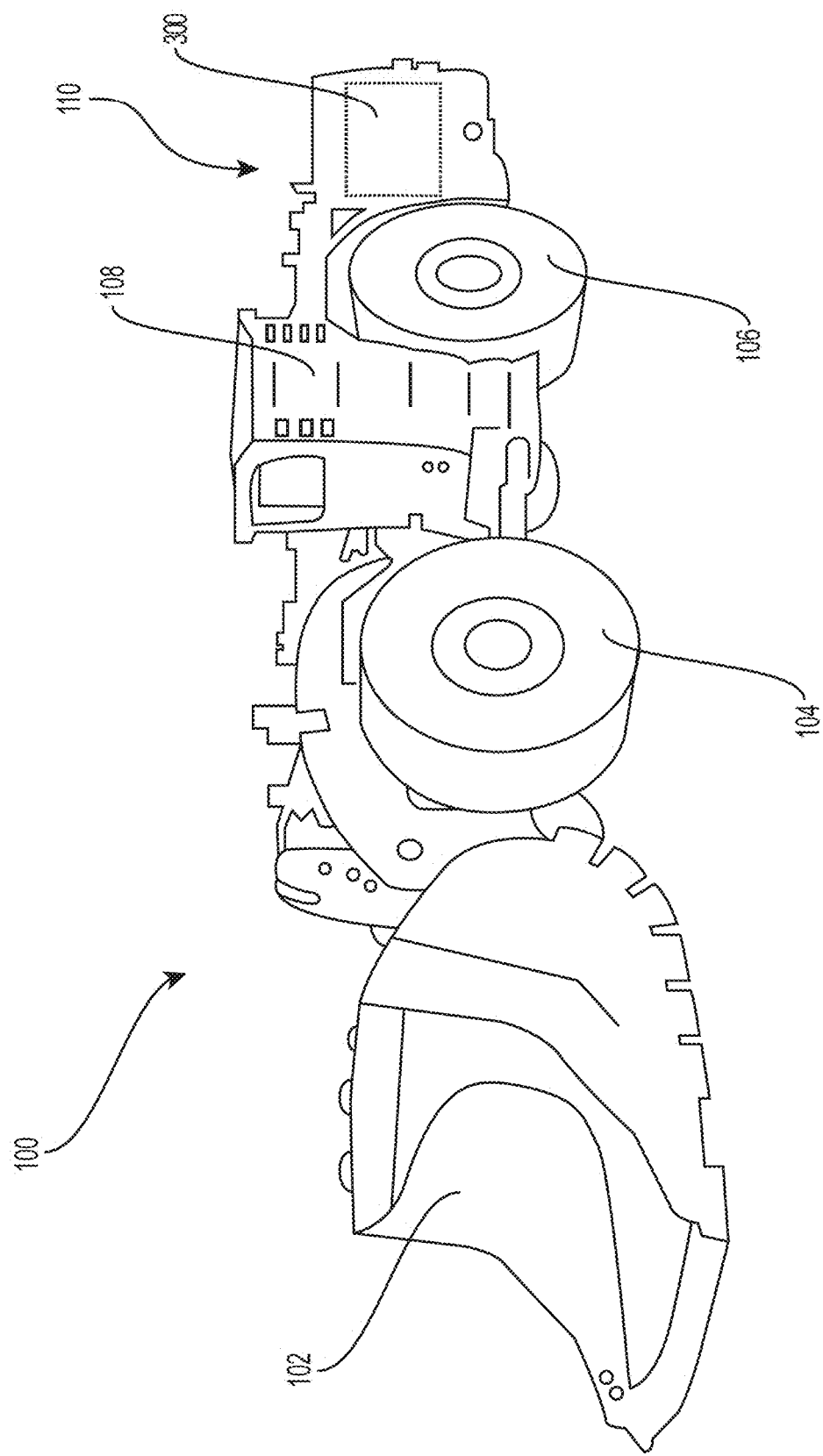
FIG. 1 shows a perspective view of a load-haul-dump machine, according to an exemplary embodiment.
Figure 2:
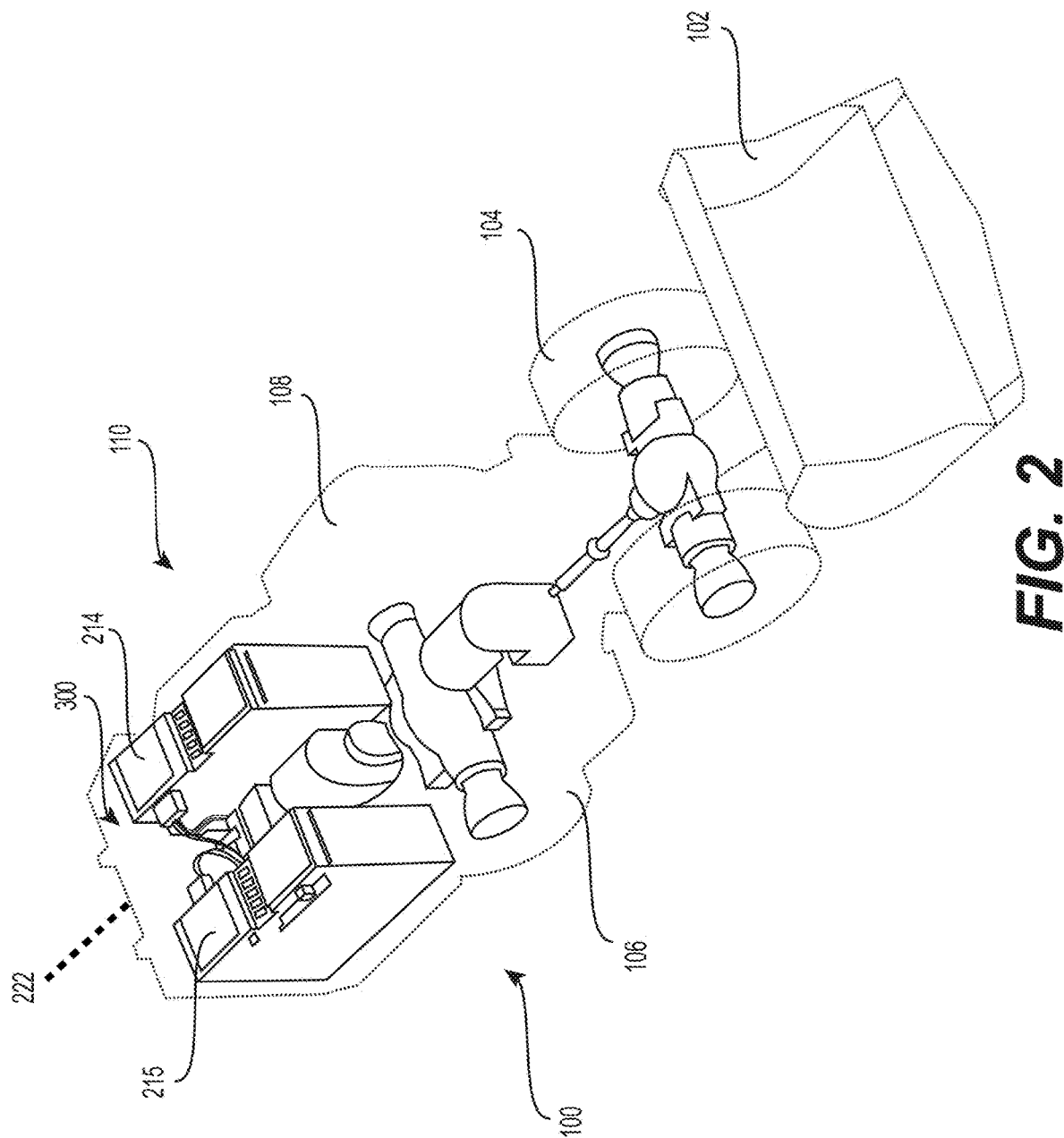
FIG. 2 shows a battery system positioned within the load-haul-dump machine of FIG. 1, according to an exemplary embodiment.

FIG. 1 shows an exemplary industrial vehicle in the form of a load-haul-dump (LHD) vehicle 100 including dump bucket 102, wheels 104, 106, operator control cabin 108, and vehicle body 110. While the discussion hereinbelow relates to attributes of an LHD vehicle 100, any of the systems and devices discussed herein may be utilized in any type of industrial vehicle known in the art, such as continuous miners, feeder breakers, roof bolters, utility vehicles for mining, underground mining loaders, underground articulated trucks, or any other vehicle used for industrial purposes, such as hauling, excavating, drilling, loading, dumping, compacting, etc. Vehicle 100 may also include a battery system 300. FIG. 2 shows an alternative view of vehicle 100 including battery system 300 including battery boxes 214, 215. As shown in FIG. 2, battery boxes 214, 215 are positioned within a rear portion of vehicle body 110, behind operator control cabin 108 and wheels 104, 106. Battery boxes 214, 215 may consume a significant amount of space within a rear portion of vehicle 100, and may have dimensions of several feet in height, length, and width. In some examples, each battery box 214, 215 may be approximately 5.5 feet tall, approximately 7 feet long, and approximately 2 feet wide. Batteries within battery boxes 214, 215 may supply power to one or more of the systems of vehicle 100, such as systems to power wheels 104, 106 and systems to move dump bucket 102. Battery system 300 of vehicle 100 may include battery boxes 214, 215 positioned on opposing sides of a central longitudinal axis 222 of vehicle 100, with battery box 214 on a left side of vehicle 100 and battery box 215 on a right side of vehicle 100. By positioning battery boxes 214, 215 on opposing sides of a central longitudinal axis 222 of vehicle 100, the weight of battery boxes 214, 215 may be evenly distributed across the rear portion of vehicle 100 and separation of battery boxes 214, 215 within vehicle body 110 may mitigate damage to one of battery boxes 214, 215 when a failure or accident occurs effecting the other battery boxes 214, 215.

Battery system 300 may provide electrical power to operate vehicle 100. Battery boxes 214, 215 may be sealed such that components within battery boxes 214, 215 are entirely enclosed by battery boxes 214, 215, which may prevent unwanted material such as sand, dust, or rocks from entering battery boxes 214, 215 and preventing damage to component within battery boxes 214, 215. Battery boxes 214, 215 may include removable panels to allow access to components with battery boxes 214, 215.

Figure 3:
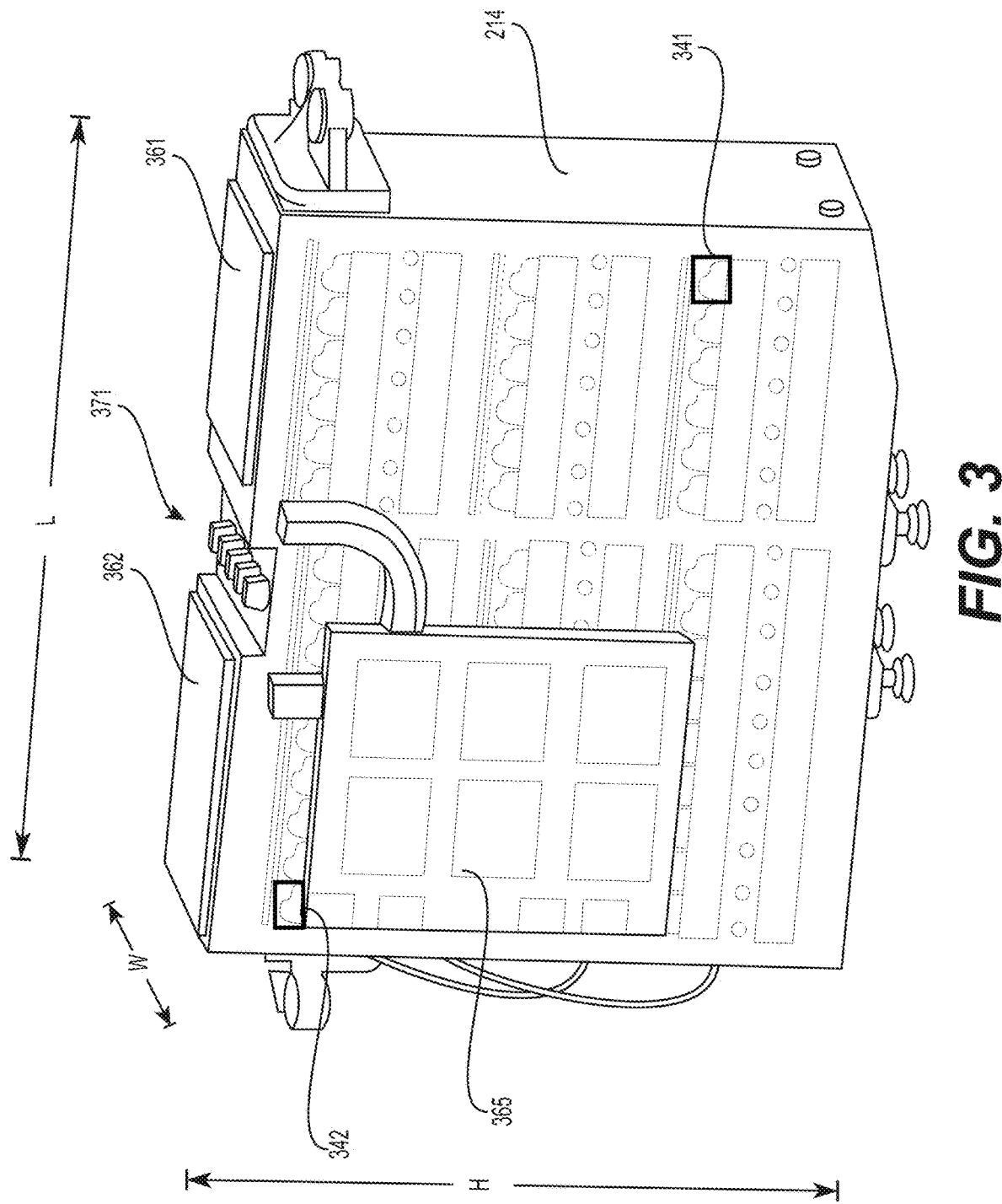
FIG. 3 shows a perspective view of a portion of the battery system from FIG. 2, according to an exemplary embodiment.

FIG. 3 illustrates battery box 214 with a side panel removed and controller 365 connected to the battery system 300 (FIG. 2). Each of battery boxes 214, 215 of battery system 300 may have the internal components shown in FIG. 3. Battery system 300 may include all of the components shown in FIG. 3, and also all of the components within battery box 315 (not shown) such that the components with each battery box 214, 215 functions as a single system. A plurality of battery modules 341, 342 may be positioned in battery box 214. A battery module 441, 442 may include a plurality of battery cells within each battery module 441, 442. In some examples, battery system 300 may include 2,160 battery cells and each battery cell may include fast-charge batteries. In some examples, each battery cell may include one or more lithium-ion batteries. In some examples, each battery module 341, 342 may include 12 battery cells connected in series. Each battery module 341, 342 may have the following specifications: 39.4 nominal voltage, 30 Amp hours capacity, and 1.188 kilowatt hours energy capacity. Battery modules 341, 342 may be liquid cooled, may include one or more sensors to monitor the voltage and temperature of the module, and may include integrated resistive cell balancing.

Battery box 214 may be divided into two sides by a central plate 571 (shown in FIG. 5) extending through the entire length L and height H of battery box 214, and dividing the width W of battery box 214 in half. FIG. 3 shows the configuration of battery modules 341, 342 on a first side of battery box 214, and a second side (not shown) of battery box 214 may be on an opposing side of plate 571. The second side of battery box 214 may mirror the configuration of the first side of battery box 214.

As shown in FIG. 3, battery box 214 may include six rows of battery modules 341, 342 on each side of plate 571. The same configuration of battery modules 341, 342 may be on the opposing side of plate 571 within battery box 214 including three rows of nine battery modules 341, 341 and three rows of six battery modules. In some examples, bus bars may connect the battery modules 341, 342 to each other.

Each battery box 214, 215 may include five battery strings. Each battery string may include eighteen battery modules connected in series with each other. Each string of battery modules 341, 342 may have the specifications of 712 nominal voltage, 30 Amp hours capacity, and 21.3 kilowatt hours energy capacity. Vehicle 100 may be configured to operate by utilizing one or more strings of 18 battery modules 341, 342. Each battery box 214, 215 may include five battery strings of eighteen battery modules 341, 342. Within battery box 214, each battery string may be connected to each other in parallel, and the power specification of the five battery strings connected in parallel may be 712 nominal voltage, 150 Amp hours capacity, and 106.5 kilowatt hours energy capacity. Each of the five strings of eighteen battery modules in battery box 214 may have an independent battery management unit and an independent control circuit connected to the string of eighteen battery modules. In some examples, each independent battery management unit may be a control unit configured to monitor one or more of the total voltage of the battery modules, voltages of individual cells, minimum and maximum cell voltage, average temperature, coolant intake temperature, coolant output temperature, temperatures of individual cells, state of charge of the battery module or the individual cells, state of power of the battery module, current in or out of the battery module or the individual cells of the battery module, or any other parameter known in the art.

Controller 365 may be a low voltage controller, for example a controller operated at 24 volts. By separating the low voltage controller 365 from the high voltage components at the top of battery box 214, the battery system 300 may be repaired and/or serviced without a technician having to be close to the dangerous high voltage components of system 300. Removable access panels 361, 362 provide access to the high voltage components at the top of battery box 214. Disconnect switches 371 may be positioned at the top of battery box 214. Each battery string of the five battery strings within battery box 214 may have a disconnect switch 371. By removing a disconnect switch 371, the respective battery string may be disconnected.

FIG. 4 shows a top view of battery box 214 with removable panels 361, 362 and disconnect switches 371. Top portion 401 includes high voltage components of battery system 300. Top portion 401 of battery box 214 is shown in FIG. 5 with panel 362 removed and the other portions outside of portion 401 (to the right of axis 775) of battery box 214 are omitted. As shown in FIG. 5, plate 571 extends through a central portion of battery box 214 and separates the interior portion of battery box 214 into two sides 573, 575. Positive connections of battery modules 341, 342 positioned on first side 573 of battery box 214 are separated from negative connections of battery modules 341, 342 positioned on second side 575 by plate 571. Plate 571 extends through a central, longitudinal portion of battery box 214 to provide structural support to battery box 214. Plate 571 also provides safety for a technician accessing battery modules within a side 573, 575 of battery box 214 by separating the positive battery connections on side 573 from the negative battery connections on side 575. In some examples, plate 571 may be a steel plate and/or may be between 4 mm and 20 mm thick, for example 8 mm thick. Plate 571 may prevent battery box 214 from crushing from the force exerted by falling rocks or other debris in a mining environment, and provides additional structural safety to address the hazards of a mining environment.

Contactors 546-555 may be connected to each of the five battery strings in battery box 214. Contactors 546-555 and other high-voltage components may be positioned at a top portion of battery box 214. By positioning high-voltage components at a top portion of battery box 214, the lower portion of battery box 214 may be accessed to conduct maintenance and repair on battery box 214 without a technician having to be close to the dangerous high voltage components of system 300. Each of the five battery strings in battery box 214 may be connected to a contactor 546-555 at a negative terminal of the battery string and a separate contactor 546-555 at a positive terminal of the battery string. In some examples, each contactor 446, 447 may be connected to two different battery modules 341, 342 of a battery string. A first set of contactors 546-550 may be connected to positive terminals of each of the five battery strings of 18 battery modules 341, 342, respectively, and a second set of contactors 551-555 may be connected to negative terminals of each of the five battery strings of 18 battery modules 341, 342. The first set of contactors 546-550 connected to positive terminals of battery modules 341, 342 may be positioned on first side 573 of battery box 214 and the second set of contactors 551-555 connected to negative terminals of battery modules 441, 442 may be positioned on second side 575 of plate 571. In some examples, wiring connecting the positive terminals of battery modules 341, 342 may be spaced from wiring connecting the negative terminals of battery modules 341, 342. For example, wiring connecting the positive terminals of battery modules 341, 342 may be positioned at on side of battery box 214 and wiring connecting the negative terminals of battery modules 341, 341 may be positioned at an opposite side, or interior portion of, battery box 214. Plate 571 may extend in the direction of the height H of battery box 214 such that plate 571 extends above each contactor 546-555 and provides a physical separation between contactors 546-550 connected to positive terminals of battery modules 441, 442 and contactors 551-555 connected to negative terminals of battery modules 441, 442. By physically separating contactors 546-550 connected to positive terminals and contactors 551-555 connected to negative terminals, plate 571 provides safety for a technician accessing battery modules 341, 342 or other components of battery system 300 by preventing unwanted connection between positive and negative terminals of battery modules 341, 342. For example, the physical barrier of plate 571 between positive and negative battery terminals may prevent the accidental connection of a positive terminal and a negative terminal of battery modules 341, 342, such as by blocking a tool from connecting positive and negative terminals.

Figure 6:
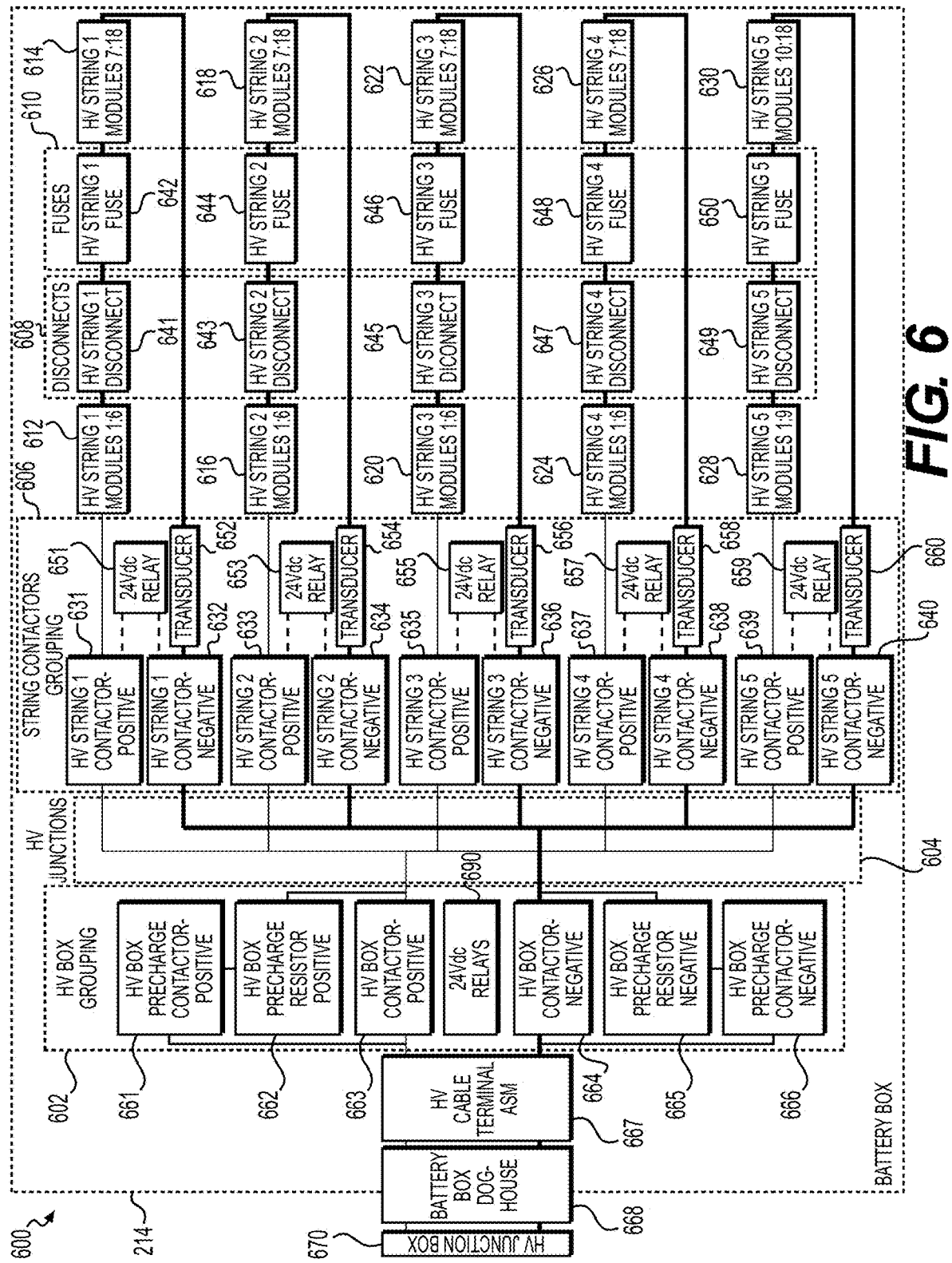
FIG. 6 shows a schematic of a battery system, according to an exemplary embodiment.

FIG. 6 further illustrates the exemplary electronics architecture 600 discussed above within one of battery boxes 214, 215 of battery system 300. Electronics architecture 600 may include five high voltage battery strings 612, 614, 616, 618, 620, 622, 624, 626, 628, 630. Each high voltage battery string (HV Strings 1-5 shown in FIG. 6) may include eighteen battery modules. Throughout this disclosure, a high voltage battery string may be referred to as "HV String" as shown in FIG. 6. In HV String 1, battery modules 1-6 are connected in series in a first section 612, then a high voltage string disconnect switch 641 and a high voltage string fuse 642 is connected to the battery string, and then battery modules 7-18 of HV String 1 are connected to the high voltage string fuse in a second section 614. Each of HV Strings 2-4 may have a similar structure as HV String 1. In HV String 5, battery modules 1-9 are connected in series in a first section 628, then a high voltage string disconnect switch 649 and a high voltage string fuse 650 is connected to the battery string, and then battery modules 10-18 of HV String 5 are connected to the high voltage string fuse 650 in a second section 630. By providing separate disconnect switches 641, 643, 645, 647, 649 and fuses 642, 644, 646, 648, 650 for each high voltage battery string (HV Strings 1-5), electronics architecture 600 may increase the safety of the battery system 300 by allowing the system to disconnect each battery string independently and operate without one or more disconnected strings (HV Strings 1-5). Each battery string may connect to two high voltage contactors 631-640, a high voltage contactor 631, 633, 635, 637, 639 at the battery strings positive terminal and a high voltage contactor 632, 634, 636, 638, 640 at the battery strings negative terminal. Each of the high voltage string contactors 631-640 may be included within string contactors grouping 606. Also, each of the high voltage string contactors 631-640 may be connected to a 24 Vdc relay circuit 651, 653, 655, 657, 659 which may include a string controller or battery management system for monitoring the operating parameters of the high voltage battery string (HV Strings 1-5). Each string controller may monitor each battery cell within the respective battery string (HV Strings 1-5) and may be configured to open the respective string contactors 631, 632, 633, 634, 635, 636, 637, 638, 639, 640 if a cell operates outside of its normal operating parameters (or any other defined threshold value).

By including separate contactors 631-640 for each of the five high voltage battery strings, the electronics architecture 600 can monitor each high voltage battery string's operating parameters and disconnect any individual battery string 612, 614, 616, 618, 620, 622, 624, 626, 628, 630 should a failure occur. For example, HV String 5 contactors 639, 640 may be opened, and thus disconnecting HV String 5, when a battery in HV String 5 is detected to be operating at a voltage outside of its normal operating parameters.

If a technician or other operator needs to access a battery string of electronics architecture 600, high voltage string disconnects 641, 643, 645, 647, 649 for a particular battery string may be removed or switched to an off position, which disconnects power from that battery string and provides a physically verifiable disconnection of the battery string. Each of the high voltage string contactors 631-640 is connected to a high voltage box grouping 602 via high voltage junctions 604.

The high voltage box grouping 602 provides additional redundancy in electronics architecture 600 and provides an additional control system for monitoring the power output of the five high voltage battery strings 1-5. The negative terminal high voltage string contactors 632, 634, 636, 638, 640 are connected to a negative terminal high voltage box contactor 664 within the high voltage box grouping 602, and the positive terminal high voltage string contactors 631, 633, 635, 637, 639 are connected to a positive terminal high voltage box contactor 663. The positive and negative terminal high voltage box contactors 663, 664 provide a means to shut off electrical power to all five high voltage battery strings by opening both contactors 663, 664. To limit the inrush current without limiting the operating current of electronics architecture 600, each of the positive and negative terminal high voltage box contactors 663, 664 is connected to a precharge circuit including a high voltage box precharge resistor 662, 665 and a high voltage box precharge contactor 661, 666. The high voltage box precharge resistors 662, 665 and the high voltage box precharge contactors 661, 666 protect the high voltage box contactors 663, 664 from extreme inrush currents from the five high voltage battery strings, which helps prevent high voltage box contactor 663, 664 failures. Each of the high voltage box contactors 663, 664 and the high voltage box precharge contactors 661, 666 may be connected to a 24 Vdc relay circuit 690, and each of the high voltage box contactors 663, 664 and the high voltage box precharge contactors 661, 666 may be connected to separate controllers. The separate controllers may be part of the 24 Vdc relay circuit 690 and may monitor the voltage and other operating parameters of the high voltage battery strings 1-5 within the battery box 214. The high voltage box group 602 may be connected to a high voltage cable terminal algorithmic state machine 667, which is then connected to a battery box doghouse 668 and then to a high voltage junction box 670 of the electronics architecture 600 to then supply electrical power to run a vehicle.

FIG. 6 provides an electronic architecture 600 for a single battery box 214, 215. By providing several contactors at several different layers of the electronics architecture 600, battery system 300 may maintain performance even when individual battery strings of the battery system 300 fail. For example, if one of the five battery strings should fail or operate outside of normal operating parameters, a technician may actuate the high voltage string disconnect 641, 643, 645, 647, 649 for that particular string to disconnect the string from the battery system and allow the remaining battery strings to supply power to a vehicle. Also, should a high voltage string contactor fail (e.g. weld shut and not be able to open to disconnect power from the battery string), electronic architecture 600 may open the contactors 661, 663, 664, 666 of the high voltage box grouping 602 to disconnect the battery strings from the battery system and stop the supply of power to the vehicle. In some examples, vehicle 100 may include an electronic stop (e-stop) button or actuator which, when activated, opens all of the contactors of electronics architecture 600 to completely disconnect the battery system 300.

Figure 7:
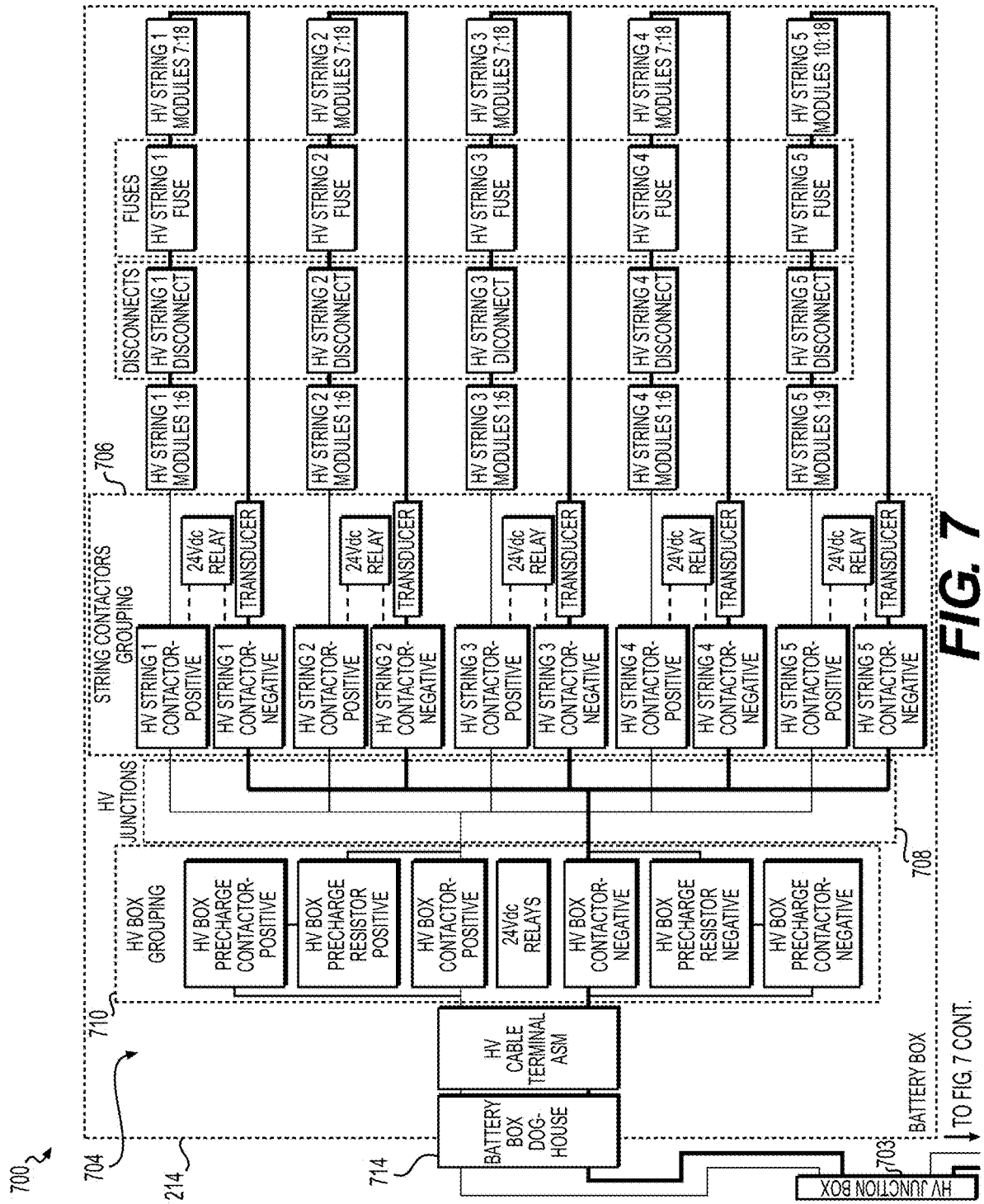
FIGS. 7 and 7 CONT. show a schematic of a parallel battery system, according to an exemplary embodiment.
Figure 7:
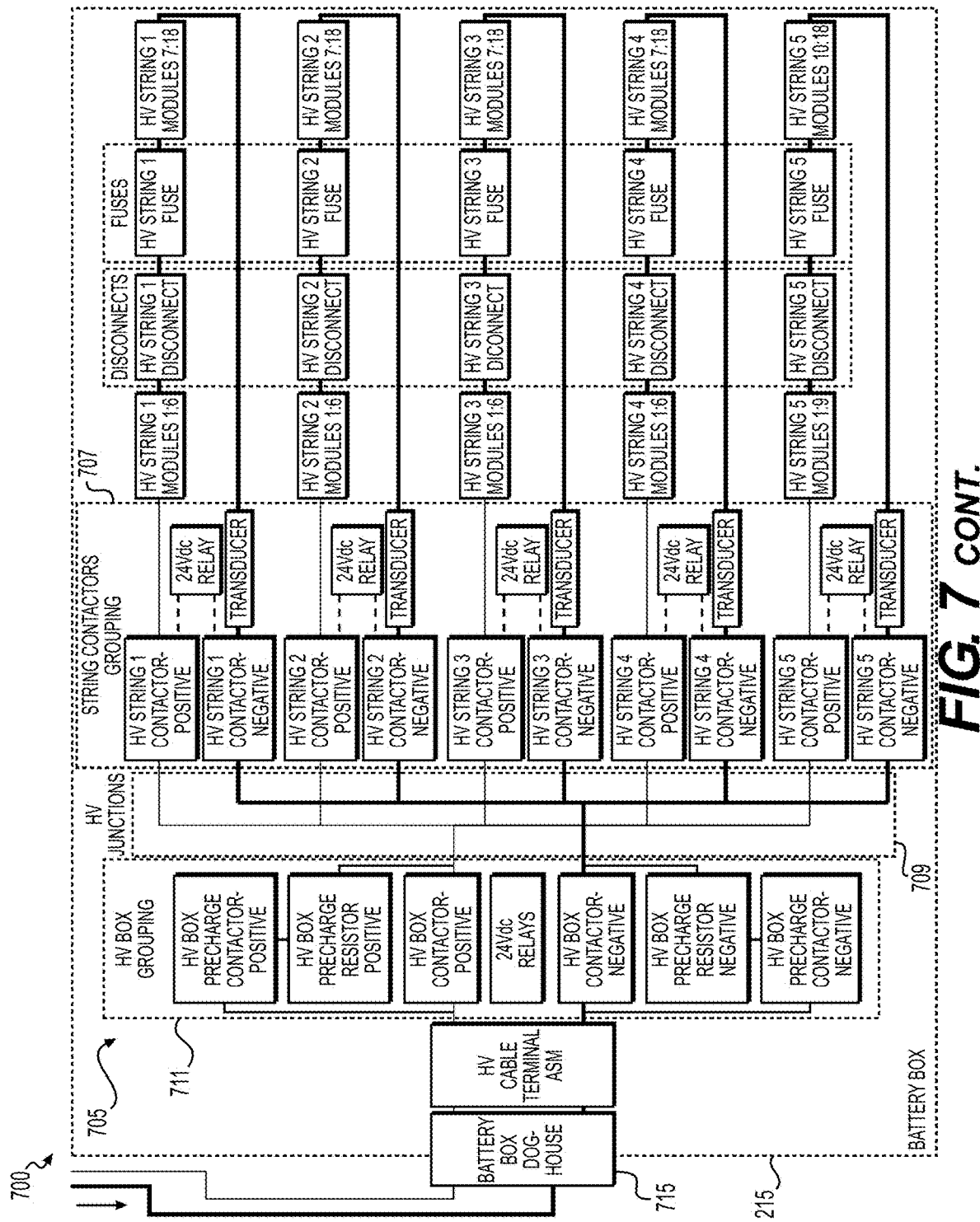

FIG. 7 illustrates a complete electronics architecture 700 of a battery system 300 including two battery boxes 214, 215. Electronics architecture 700 includes the electronic architecture 600 discussed hereinabove in each of the two battery boxes 214, 215 of battery system 300, including five high voltage battery strings per battery box 214, 215, string contactor groupings 706, 707 connected to high voltage box groupings 710, 711 via high voltage junctions 708, 709, battery box doghouses 714 715, and a high voltage junction box 703. The two electronic architectures 704, 705 are connected in parallel at the high voltage junction box 703. Electronics architecture 700 may have any of the features described in relation to electronics architecture 600. In some examples, electronics architecture 700 may include an additional controller or battery management system monitoring the voltage supplied to the high voltage junction box 703 that receives the output voltage of each battery architecture 704, 705 of the two battery boxes 214, 215 in battery system 300. Power is outputted from battery system 300 from high voltage junction box 703 and directed to various components of vehicle 100.

Electronics architecture 700 may include systems to adjust for the failure of one or more contactors within electronics architecture 700. For example, one or more controllers connected to the high voltage box grouping 710 may monitor each high voltage string contactor in string contactors grouping 706. When a failure is detected in one or more string contactors of string contactors grouping 706, the one or more controllers of high voltage box grouping 710 may open all of the contactors within high voltage box grouping 710 to disconnect the five battery strings from the system. Electronics architecture 700 may power a vehicle when all of the contactors of high voltage box grouping 710 are opened by relying on power supplied by battery box 215. By providing multiple layers of contactors within electronics architecture 700, the battery system may disconnect one or more failed battery strings via the contactors and maintain operation of the system when one or more of the high voltage battery strings fails.

INDUSTRIAL APPLICABILITY

The battery system 300 of the present disclosure including two battery boxes 214, 215 is specifically designed to operate in an industrial environment, and includes features to address the unique hazards and accessibility issues associated with operating a battery-powered vehicle within an industrial environment. For example, industrial vehicles require significant amounts of power to operate, and thus very large battery assemblies are often required to operate the machine effectively. Battery system 300 is capable of storing at least 200 kilowatt hours of energy, and in some examples may store 213 kilowatt hours of energy. In some examples, battery system 300 can output in excess of 800 kilowatts of power. Dividing the large battery system 300 into two separate, sealed containers increases the safety of operating the industrial vehicle and mitigates potential failures by not concentrating the entire battery assembly in a single housing. By positioning high voltage components of battery system 300 at a top portion of battery boxes 214, 215 a technician or other person may access the interior portion of each battery box 214, 215 without coming close to or into contact with dangerous high voltage components of the battery system 300. Furthermore, incorporating central plate 571 extending through a central portion of each battery box 214, 215 provides structural support to battery box and prevents damage to battery system 300 when rocks or other debris fall or otherwise come into contact with battery system 300 while vehicle 100 is operated within an industrial environment. In addition, plate 571 provides separation between positive connections of battery modules on a first side 575 of each battery box 214, 215 and negative connections of battery modules on a second side 573 of each battery box 214, 215 which prevents unwanted voltage connection between batteries and provides additional safety for a technician while accessing battery system 300.

Electronics architecture 600, 700 of battery system 300 includes several design features that increase the safety and operability of battery system 300 in an industrial vehicle 100. For example, providing several layers of contactors, including individual string contactors and high voltage contactors connected to each of the individual battery strings, provides several layers of the battery system that are separately monitored and controlled, which allows the system to disconnect portions of the system in the event of a battery failure. Furthermore, providing disconnect switches within each battery string of battery system 300 provides additional safety and another means to disconnect a battery string in the event of a failure. Since battery system 300 may be subject to exposure to dirt, rocks, and other debris which could cause a battery failure, the ability for electronics architecture to quickly adjust battery system 300 and allow battery system 300 to continue providing power to vehicle 100 while disconnecting a portion of the system that has failed increases the vehicles durably.

It will be apparent to those skilled in the art that various modifications and variations can be made to the disclosed battery systems without departing from the scope of the disclosure. Other embodiments of the battery system will be apparent to those skilled in the art from consideration of the specification and the accompanying figures. It is intended that the specification, and, in particular, the examples provided herein be considered as exemplary only, with a true scope of the disclosure being indicated by the following claims and their equivalents.

We claim:

1. A method of monitoring a battery system of an industrial vehicle, the battery system including:
a first string of battery modules, the first string including at least two battery modules connected in series;
a first contactor connected to a positive end of the first string of battery modules;
a second contactor connector to a negative end of the first string of battery modules;
a third contactor connected to the first contactor;
a fourth contactor connected to the second contactor; and
one or more controllers configured to monitor the first contactor and the second contactor;
a second string of battery modules, the second string including at least two battery modules connected in series, wherein the first string of battery modules is connected to the second string of battery modules in parallel;
a fifth contactor connected to a positive end of the second string of battery modules and connected to the third contactor; and
a sixth contactor connector to a negative end of the second string of battery modules and connected to the fourth contactor;
wherein the method comprises:
receiving, at the one or more controllers, an indication of a failure of one of the first contactor and the second contactor; and
opening, via the one or more controllers, at least one of the third contactor or the fourth contactor.

2. The method of claim 1, further comprising:
receiving, at the one or more controllers, an indication of a failure of one of the third contactor and the fourth contactor; and
opening, via the one or more controllers, at least one of the first contactor or the second contactor.

3. The method of claim 1, wherein the battery system further comprises:
a first precharge contactor and a first precharge resistor connected to a positive end of the first string of battery modules; and
a second precharge contactor and a second precharge resistor connected to a negative end of the first string of battery modules.

4. The method of claim 1, wherein the method further comprises:
receiving, at the one or more controllers, an indication of a failure of one of the fifth contactor, or the sixth contactor; and
opening, via the one or more controllers, at least one of the third contactor or the fourth contactor in response to the indication of a failure of one of the fifth contactor or the sixth contactor.

5. The method of claim 1, wherein the battery system further comprises:
a first disconnect switch connected to the first string of battery modules; and
a second disconnect switch connected to the second string of battery modules;
wherein the battery system is configured to operate with 1) both the first string of battery modules and the second string of battery modules connected to the battery system, 2) only the first string of battery modules connected to the battery system and the second disconnect switch actuated to disconnect the second string of battery modules from the battery system, or 3) only the second string of battery modules connected to the battery system and the first disconnect switch actuated to disconnect the first string of battery modules from the battery system.

6. The method of claim 1, wherein the indication of a failure of one of the first contactor and the second contactor includes an indication that one of the first contactor or the second contactor has welded closed.

7. The method of claim 1, wherein the battery system is configured to generate at least 200 kilowatt hours of energy.

8. The method of claim 1, wherein the one or more controllers is a first one or more controllers; wherein the first string of battery modules, the first contactor, the second contactor, the third contactor, and the fourth contactor are sealed within a first housing; and wherein the battery system further comprising:
- a second string of battery modules including at least two battery modules connected in series;
- a fifth contactor connected to a positive end of the second string of battery modules;
- a sixth contactor connector to a negative end of the second string of battery modules;
- a seventh contactor connected to the fifth contactor;
- an eighth contactor connected to the sixth contactor; and
- a second one or more controllers configured to monitor the fifth contactor and the sixth contactor;
- wherein the second string of battery modules, the fifth contactor, the sixth contactor, the seventh contactor, the eighth contactor, and the second one or more controllers are sealed within a second housing; and
- wherein the method further comprises:
- opening, via the one or more controllers, at least one of the third contactor or the fourth contactor; and
- operating the industrial vehicle utilizing only power provided by the second string of battery modules.

9. A battery system provided in an industrial vehicle, the battery system comprising:
- a first string of battery modules, the first string including a plurality of battery modules connected in series;
- a first contactor connected to a negative output of the first string of battery modules;
- a second contactor connected to a positive output of the first string of battery modules;
- a third contactor and a first precharge resistor each connected to the first contactor;
- a first precharge contactor connected to the first precharge resistor;
- a fourth contactor and a second precharge resistor each connected to the second contactor; and
- a second precharge contactor connected to the second precharge resistor;
- a second string of battery modules, the second string including a plurality of battery modules connected in series;
- a fifth contactor connected to a negative output of the second string of battery modules;
- a sixth contactor connected to a positive output of the second string of battery modules;
- wherein the third contactor and the first precharge resistor are each connected to the fifth contactor; and
- wherein the fourth contactor and the second precharge resistor are each connected to the sixth contactor.

10. The battery system of claim 9, further comprising:
- a first controller connected to the first contactor and the second contactor;
- a second controller connected to the fifth contactor and the sixth contactor; and
- one or more controllers connected to the third contactor and the fourth contactor.

11. The battery system of claim 9, further comprising:
- a first disconnect switch connected to the first string of battery modules; and
- a second disconnect switch connected the second string of battery modules.

12. The battery system of claim 9, wherein the battery system is positioned within a sealed housing.

13. The battery system of claim 9, wherein each of the first string of battery modules and the second string of battery modules is configured to generate between 15 and 30 kilowatts per hour.

14. The battery system of claim 9, further comprising:
- a third string of battery modules including a plurality of battery modules connected in series;
- a seventh contactor connected to a negative output of the third string of battery modules;
- an eighth contactor connected to a positive output of the third string of battery modules;
- a fourth string of battery modules including a plurality of battery modules connected in series;
- a ninth contactor connected to a negative output of the fourth string of battery modules;
- a tenth contactor connected to a positive output of the fourth string of battery modules;
- a fifth string of battery modules including a plurality of battery modules connected in series;
- an eleventh contactor connected to a negative output of the fifth string of battery modules;
- a twelfth contactor connected to a positive output of the fifth string of battery modules;
- wherein the third contactor and the first precharge resistor are each connected to the seventh contactor, the ninth contactor, and the eleventh contactor; and
- wherein the fourth contactor and the second precharge resistor are each connected to the eighth contactor, the tenth contactor, and the twelfth contactor.

15. The battery system of claim 14, further comprising:
- a sixth string of battery modules including a plurality of battery modules connected in series;
- a thirteenth contactor connected to a negative output of the sixth string of battery modules;
- a fourteenth contactor connected to a positive output of the sixth string of battery modules;
- a fifteenth contactor and a third precharge resistor each connected to the thirteenth contactor;
- a third precharge contactor connected to the third precharge resistor;
- a sixteenth contactor and a fourth precharge resistor each connected to the fourteenth contactor; and
- a fourth precharge contactor connected to the fourth precharge resistor;
- wherein the first, second, third, fourth, and fifth strings of battery modules are sealed within a first housing; and
- wherein the sixth string of battery modules is sealed within a second housing.

16. A battery system provided in an industrial vehicle, the battery system comprising:
- a housing comprising:
- a first string of battery modules including a first plurality of battery modules connected in series and a first physical disconnect switch connected to the first plurality of battery modules;
- a second string of battery modules including a second plurality of battery modules connected in series and a second physical disconnect switch connected to the second plurality of battery modules, wherein the first string of battery modules and the second string of battery modules are connected in parallel;
- a first contactor connected to a negative terminal of the first string of battery modules;
- a second contactor connected to a positive terminal of the first string of battery modules;
- a third contactor connected to a negative terminal of the second string of battery modules;

a fourth contactor connected to a positive terminal of the second string of battery modules;
a fifth contactor and a first precharge resistor connected to the first contactor and the third contactor;
a sixth contactor connected to the first precharge resistor;
a seventh contactor and a second precharge resistor connected to the second contactor and the fourth contactor; and
an eighth contactor connected to the second precharge resistor.

17. The battery system of claim 16, wherein the battery system is configured to operate when: 1) the first string of battery modules and the second string of battery modules are connected; 2) the first string of battery modules is connected and the second string of battery modules is disconnected via the second physical disconnect switch; and 3) the second string of battery modules is connected and the first string of battery modules is disconnected via the first physical disconnect switch.

* * * * *